United States Patent
Lee et al.

(10) Patent No.: US 12,424,547 B2
(45) Date of Patent: Sep. 23, 2025

(54) BACK-END-OF-LINE MEMORY DEVICES AND METHODS FOR OPERATING THE SAME

(71) Applicant: Taiwan Semiconductor Manufacturing Company, Ltd., Hsinchu (TW)

(72) Inventors: Wai-Kit Lee, Hsinchu (TW); Yun-Feng Kao, Hsinchu (TW); Katherine H. Chiang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 189 days.

(21) Appl. No.: 18/232,555

(22) Filed: Aug. 10, 2023

(65) Prior Publication Data

US 2025/0054861 A1 Feb. 13, 2025

(51) Int. Cl.
  *G11C 11/4076* (2006.01)
  *H01L 23/522* (2006.01)
  (Continued)

(52) U.S. Cl.
  CPC ...... *H01L 23/5283* (2013.01); *G11C 11/4076* (2013.01); *H01L 23/5226* (2013.01);
  (Continued)

(58) Field of Classification Search
  CPC ............. H01L 23/5283; H01L 23/5226; G11C 11/4076; G11C 11/40; H10B 12/315;
  (Continued)

(56) References Cited

U.S. PATENT DOCUMENTS

| | | | | |
|---|---|---|---|---|
| 5,316,962 A | * | 5/1994 | Matsuo | H10B 12/395 438/242 |
| 6,261,901 B1 | * | 7/2001 | Tseng | H10D 1/042 257/E21.507 |

(Continued)

FOREIGN PATENT DOCUMENTS

| | | |
|---|---|---|
| TW | 202217637 A | 5/2022 |
| TW | 202312281 A | 3/2023 |

(Continued)

OTHER PUBLICATIONS

Office Action issued in connection with Taiwan Appl. No. 112148594 dated Sep. 4, 2024.

(Continued)

*Primary Examiner* — Michael T Tran
(74) *Attorney, Agent, or Firm* — FOLEY & LARDNER LLP

(57) ABSTRACT

A memory device includes a plurality of memory cells. Each of the plurality of memory cells includes a capacitor configured to store an amount of electrical charges, and a plurality of transistors electrically coupled to the capacitor. Based on a pulse signal, a first subset of the plurality of transistors are configured to form a first conduction path, and a second subset of the plurality of transistors are configured to form a second conduction path. The amount of electrical charges is configured to be altered through the first conduction path and the second conduction path.

20 Claims, 11 Drawing Sheets

(51) Int. Cl.
  *H01L 23/528* (2006.01)
  *H10B 12/00* (2023.01)
(52) U.S. Cl.
  CPC ......... *H10B 12/315* (2023.02); *H10B 12/482* (2023.02); *H10B 12/488* (2023.02)
(58) Field of Classification Search
  CPC .... H10B 12/482; H10B 12/488; H10B 12/05; H10B 12/30; H10B 12/48
  USPC ............................................ 365/72; 257/427
  See application file for complete search history.

(56) References Cited

U.S. PATENT DOCUMENTS

| | | | | |
|---|---|---|---|---|
| 2003/0234971 A1* | 12/2003 | Murade | ............ | G02F 1/136209 257/E27.111 |
| 2013/0320422 A1* | 12/2013 | Chang | ................... | H10B 12/37 438/243 |
| 2014/0246715 A1* | 9/2014 | Kamal | ................. | H10D 84/217 257/300 |
| 2019/0325107 A1 | 10/2019 | Kim et al. | | |
| 2021/0193666 A1 | 6/2021 | Gomes et al. | | |
| 2022/0139927 A1* | 5/2022 | Chang | ................... | H10B 12/50 257/296 |
| 2022/0173108 A1* | 6/2022 | Lee | ................... | H01L 23/53266 |
| 2022/0223604 A1* | 7/2022 | Park | ....................... | H10B 12/30 |
| 2023/0238293 A1 | 7/2023 | Sun | | |

FOREIGN PATENT DOCUMENTS

| | | |
|---|---|---|
| TW | 202318405 A | 5/2023 |
| TW | 202320232 A | 5/2023 |

OTHER PUBLICATIONS

Office Action issued in connection with Taiwan Appl. No. 112148594 dated Jan. 20, 2025.

* cited by examiner

BACK-END-OF-LINE MEMORY DEVICES AND METHODS FOR OPERATING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
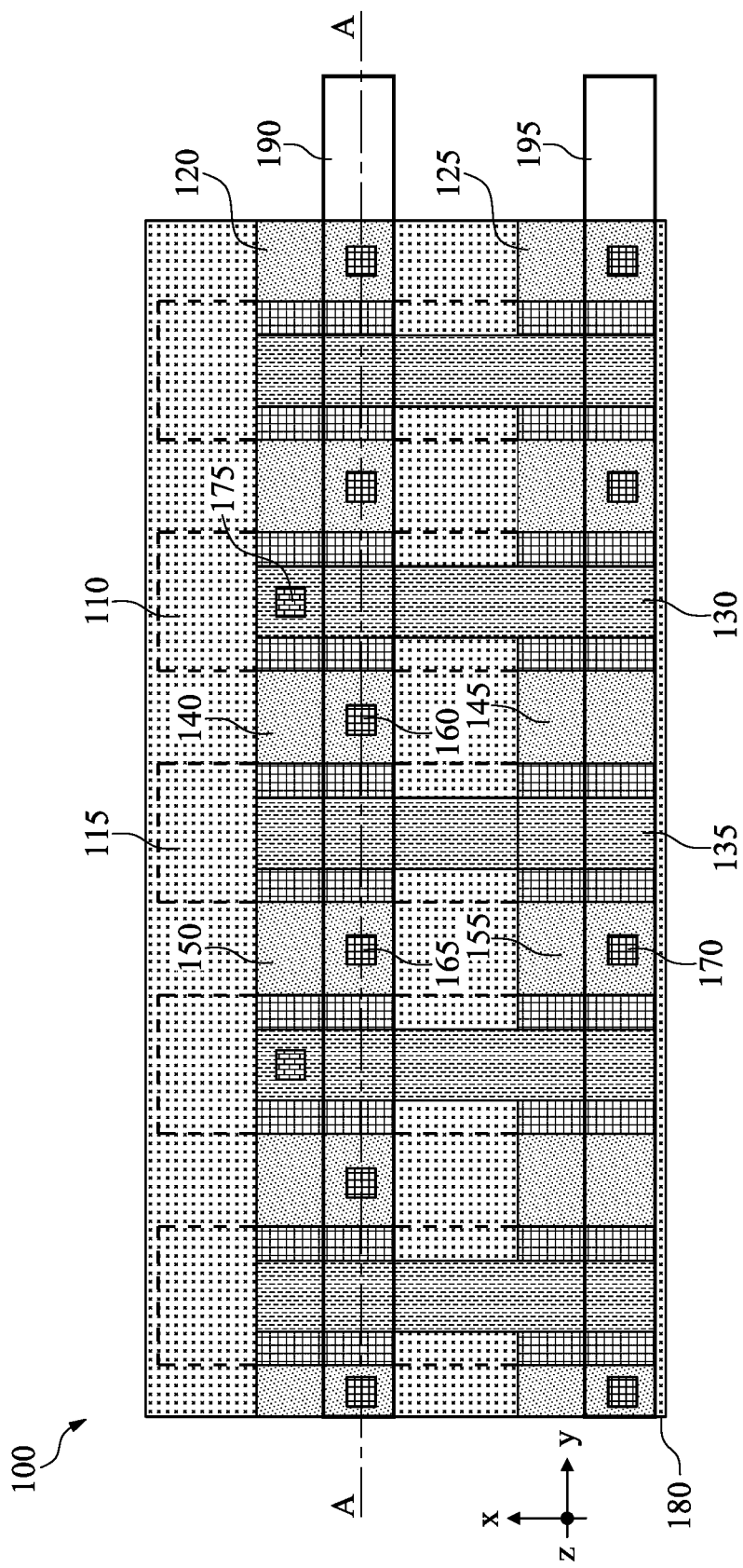
FIG. 1 illustrates a top view of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a semiconductor device can include a number of active/passive device features that collectively or respectively function as a logic circuit (e.g., transistors, capacitors, resistors, etc.), which are formed along the major surface of a semiconductor substrate. A number of dielectric layers (sometimes referred to as intermetal dielectric (IMD) layers) can be formed over such device features to embed a number of interconnect structures (e.g., conductive lines, vias) to electrically connect those device features. The IMD layer, with interconnect structures embedded therein, is sometimes referred to as a metallization layer. Those device features formed along the major surface of the semiconductor substrate are typically referred to as part of front-end-of-line (FEOL) networking/processing, and those metallization layers formed over the device features are typically referred to as part of back-end-of-line (BEOL) networking/processing.

With the continually increasing device densities achieved by modern day semiconductor manufacturing processes, developments have been proposed to fabricate memory devices in the BEOL processing for certain applications (e.g., compute-in-memory (CIM) circuits). For example, a memory device including each of its memory cells, formed of one or more transistors and one serially connected capacitor in the BEOL processing, has been proposed. Such a BEOL memory device typically has a number of continuously extending metal layer that serves as respective gate terminals of the transistors, and a number of continuously extending semiconductor layers that are disposed over the metal layers and serve as respective channels of the transistors. Further above the semiconductor layers, a number of slot-like metal layers are formed to serve as respective source terminals and drain terminals of the transistors. BEOL memory devices have been used such that data stored in array cells are transferred to a central processing unit (CPU) and/or controlled to process (e.g., analog-to-digital, digital-to-analog processing, etc.). However, the existing technologies regarding BEOL memory devices have not been entirely satisfactory in some aspects.

The present disclosure provides various embodiments of a BEOL memory device, and methods of operating the same. For example, the BEOL memory devices, as disclosed herein, may include a number of memory cells arranged as a memory array having plural columns and plural rows intersecting with each other. Along a first lateral direction, the x-axis, (e.g., each row of the memory array), a number of metal layers are arranged in parallel with one another; and along a second lateral direction, the y-axis, (e.g., each column of the memory array), a number of semiconductor layers are disposed over the metal layers and arranged in parallel with one another. Further above each of the semiconductor layers, the disclosed BEOL memory devices may include a number of via-like structures, which electrically connect some of the metal layers or structures. The BEOL memory devices, as disclosed herein, may include one or more capacitors electrically coupled to at least one of the conductive layers.

The BEOL memory devices and methods of operating the same disclosed herein allow for direct processing of data stored in the array cells without transferring the data to a CPU/controller. For example, the devices and methods disclosed herein allow for processing of data stored in, for example memory array cells or image sensors, directly without transferring the data to a controller for processing. In some embodiments, memory arrays of arbitrary sizes may be built based on a unit cell of the memory devices disclosed herein. In some embodiments, the device disclosed herein may operate both as a "normal memory" (e.g., DRAM) and an "in-situ data processing unit" simultaneously without dedicated mode switching. For example, the device described herein allows for direct processing of data stored in memory array cells without transferring the data to a CPU/controller to modulate the data, while performing normal DRAM operations, without mode switching operations. To perform such operations, the device can be controlled based on a controlling pulse. For example, the different operations may be achieved based on operational signals, where the different operations are intrinsic in operation signals. The memory devices and the methods of operating the same disclosed herein can be directly implemented in the BEOL of a chip or of an image sensor so as to enable in-memory processing, thereby enhancing density (as all the arrays are in the BEOL), speed, and power from a system perspective. While providing various advantages, the memory devices and the methods of operating the same disclosed herein can serve as and/or be compatible with a memory, for example, as in DRAM devices. Moreover, the memory devices and the methods of operating the same disclosed herein can naturally translate digital pulse train into analog value changes, and can directly realize neuromorphic computing and/or artificial intelligence.

Figure 2:
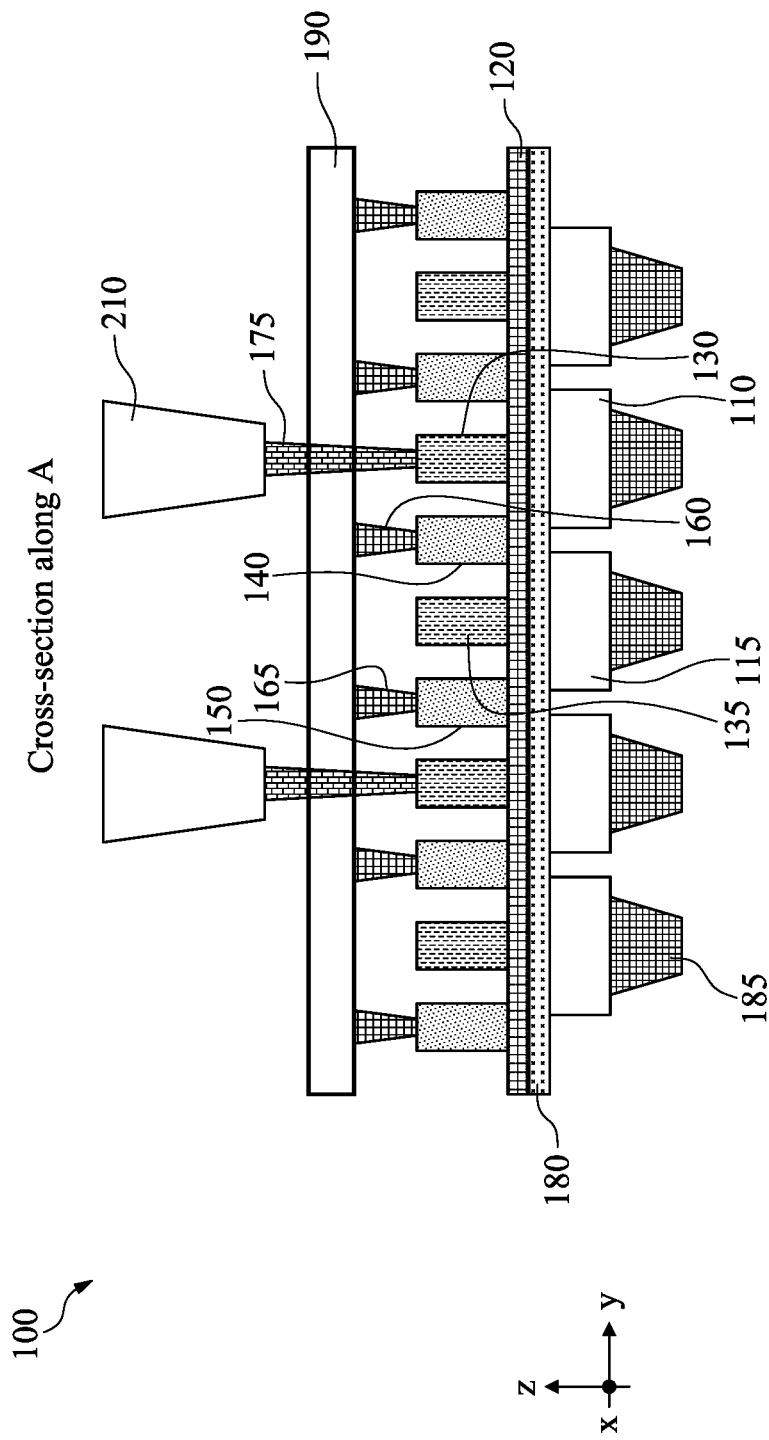
FIG. 2 illustrates a side view of a memory device, in accordance with some embodiments.

FIG. 1 illustrates atop view (or a layout design) of a memory device 100, in accordance with some embodiments. FIG. 2 illustrates a side view of the memory device 100, in accordance with some embodiments, for example, a cross-sectional view cut along line A-A of the memory device 100 shown in FIG. 1.

As shown in FIG. 1, the memory device 100 includes a first bottom conductive structure 110 and a second bottom conductive structure 115 spaced from each other, each of which extends along a first lateral direction (e.g., the X-direction). The dashed lines for the bottom conductive structures (e.g., 110, 115) indicate that the bottom conductive structures (e.g., 110, 115) are located below a dielectric layer 180 as shown in FIG. 2. The memory device 100 includes a first channel layer 120 extending along a second lateral direction (e.g., the Y-direction) and traversing a first portion of each of the first bottom conductive structure 110 and the second bottom conductive structure 115. The memory device 100 includes a second channel layer 125 extending along the second lateral direction and traversing a second portion of each of the first bottom conductive structure 110 and the second bottom conductive structure 115. The memory device 100 includes a first middle conductive structure 130 extending along the first lateral direction, disposed above the first bottom conductive structure 110, and traversing the first channel layer 120 and the second channel layer 125. The memory device 100 includes a second middle conductive structure 135 extending along the first lateral direction, disposed above the second bottom conductive structure 115, and traversing the first channel layer 120 and the second channel layer 125. The memory device 100 includes a third middle conductive structure 140 disposed between the first middle conductive structure 130 and the second middle conductive structure 135, and traversing a first portion of the first channel layer 120. The memory device 100 includes a fourth middle conductive structure 145 disposed between the first middle conductive structure 130 and the second middle conductive structure 135, and traversing a first portion of the second channel layer 125. The memory device 100 includes a fifth middle conductive structure 150 disposed opposite the second middle conductive structure 135 from the third middle conductive structure 140, and traversing a second portion of the first channel layer 120. The memory device 100 includes a sixth middle conductive structure 155 disposed opposite the second middle conductive structure 135 from the fourth middle conductive structure 145, and traversing a second portion of the second channel layer 125. The memory device 100 includes a first top conductive structure 190 extending along the second lateral direction and electrically coupled to the third middle conductive structure 140 and the fifth middle conductive structure 150. The memory device 100 includes a second top conductive structure 195 extending along the second lateral direction and electrically coupled to the sixth middle conductive structure 155. The middle conductive structures (e.g., 130, 135, 140, 145, 150, 155) can be for source/drain structures. The memory device 100 includes a capacitor 210 electrically coupled to the first middle conductive structure 130. In some embodiments, the capacitor 210 may be or include a metal-insulator-metal (MIM) structure. In some embodiments, the capacitor 210 may be or include a metal-oxide-metal (MOM) structure.

In some embodiments, the memory device 100 includes a first via structure 160 connecting the third middle conductive structure 140 to the first top conductive structure 190, a second via structure 165 connecting the fifth middle conductive structure 150 to the first top conductive structure 190, and a third via structure 170 connecting the sixth middle conductive structure 155 to the second top conductive structure 165.

In some embodiments, the memory device 100 includes a fourth via structure 175 connecting the first middle conductive structure 130 to the capacitor 210. In some embodiments, the fourth via structure 175 may be shifted from the first top conductive structure 190 along the first lateral direction. In some embodiments, the fourth via structure 175 may vertically extend across any of the first top conductive structure 190 or the second top conductive structure 195. In some embodiments, an end of the fourth via structure 175 vertically extending may be connected to a capacitor (e.g., the capacitor 210).

In some embodiments, the memory device 100 includes the dielectric layer 180 and metal layers 185. As shown in FIG. 1 and FIG. 2, the dielectric layer 180 may cover a whole area, and may be disposed between the channel layers (e.g., 120, 125) and the bottom conductive structures (e.g., 110, 115). Each of the bottom conductive structures may include the respective metal layers 185 extending along the first lateral direction. The metal layers 185 are physically separated from each other and may be electrically isolated from each other. In some embodiments, an inter-metal dielectric (IMD) material may be used to isolate the metal layers 185.

The memory device 100 may be or include a memory array formed of a plurality of conductive structures (e.g., the top conductive structures, the middle conductive structures, the bottom conductive structures, etc.). Such a memory array may include a plurality of storage circuits or memory cells arranged in two or three dimensional arrays. Each memory cell may be coupled to a corresponding word line (WL), a corresponding bit line (BL), and a corresponding source line (SL). A memory controller may write data to or read data from the memory device 100 and/or the memory array formed therein according to electrical signals through WLs, BLs, and SLs. In some embodiments, the memory device 100 may include more, fewer, or different components than shown in FIG. 1.

The bottom conductive structures (e.g., 110, 115) and/or the metal layers 185 may be or include a suitable conductive material selected from the group including: copper (Cu), tantalum nitride (TaN), titanium nitride (TiN), tungsten (W), aluminum (Al), poly silicon, and combinations thereof. The dielectric layer 180 may be universally disposed over the bottom conductive structures (e.g., 110, 115) and/or the metal layers 185. The dielectric layer 180 may be formed of at least one of the following materials: hafnium oxide ($HfO_2$), silicon oxide ($SiO_2$), aluminum oxide ($Al_2O_3$), silicon oxynitride (SiON), a so-called high-k material, and combinations thereof.

In some embodiments, where the access transistors of the memory cells are configured in n-type, the channel layers (e.g., 120, 125) may be formed of at least one of the following materials: indium gallium zinc oxide (IGZO), zinc oxide (ZnO), indium oxide ($In_2O_3$), tin oxide ($SnO_2$), and combinations thereof. In some embodiments, where the access transistors of the memory cells are configured in p-type, the channel layers (e.g., 120, 125) may be formed of at least one of the following materials: nickel oxide (NiO), copper oxide ($Cu_2O$), copper aluminum oxide ($CuAlO_2$), copper gallium oxide ($CuGaO_2$), copper indium oxide ($CuInO_2$), strontium copper oxide ($SrCuO_2$), tin oxide (SnO), and combinations thereof.

In some embodiments, the via structures (e.g., 160, 165, 160, 164) may be formed of a conductive material selected from the group including: copper (Cu), tantalum nitride (TaN), titanium nitride (TiN), tungsten (W), aluminum (Al), ruthenium (Ru), cobalt (Co), poly silicon, and combinations thereof.

Figure 3:
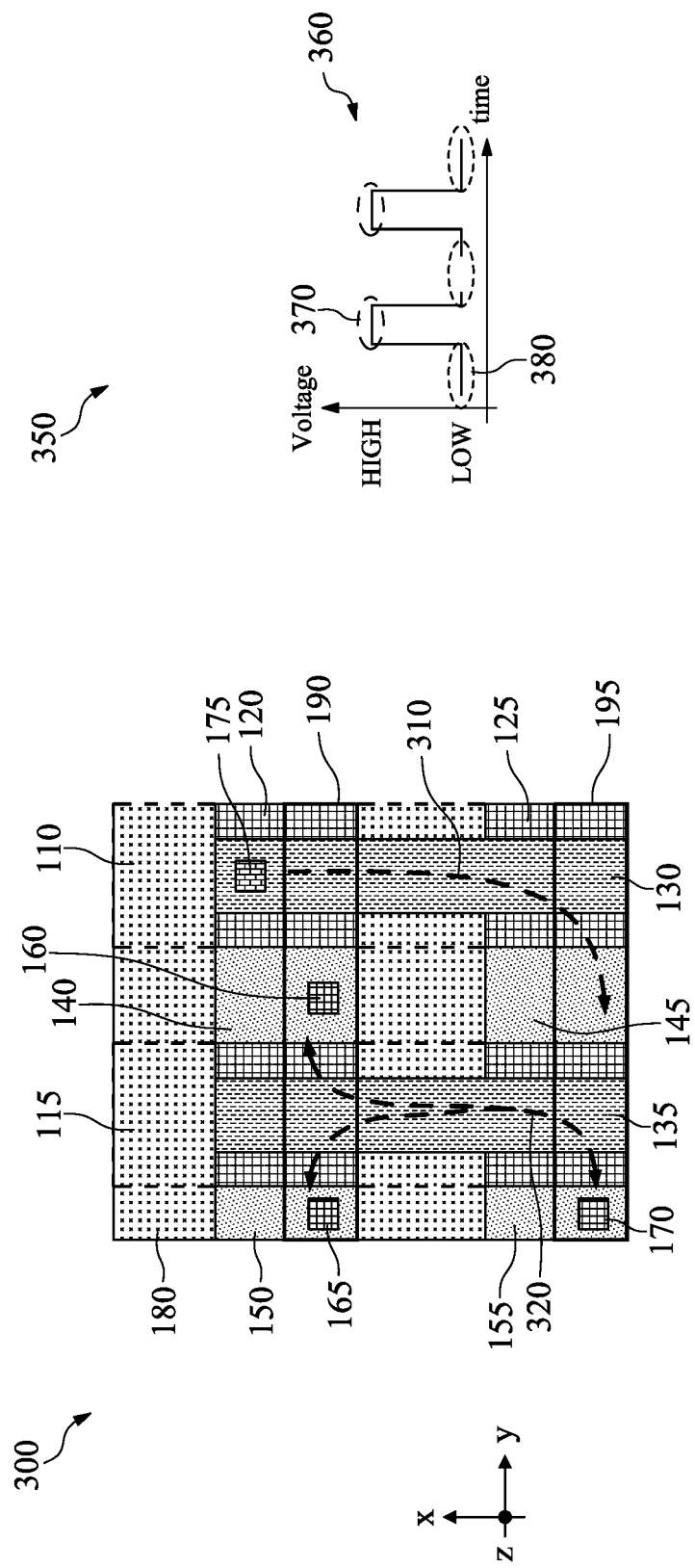
FIG. 3 illustrates a memory device and a signal applied to the memory device, in accordance with some embodiments.

FIG. 3 illustrates a memory device 300 and a signal 350 applied to the memory device 300, in accordance with some embodiments. The memory device 300 may be a portion of the memory device 100. In some embodiments, for example as shown in FIG. 3, the first and second bottom conductive structures (e.g., 110, 115), the first and second channel layers (e.g., 120, 125), the first to sixth middle conductive structures (e.g., 130, 135, 140, 145, 150, 155), the first and second top conductive structures (e.g., 190, 195), and the capacitor (e.g., the capacitor 210 shown in FIG. 2) operatively may serve as a unit memory cell. In some embodiments, the memory device 100 may include a plurality of unit memory cells. For example, a plurality of the unit memory cells (e.g., 300) may share the same channel layers (e.g., 120, 125).

In some embodiments, the first and second bottom conductive structures (e.g., 110, 115), the first and second channel layers (e.g., 120, 125), the first to sixth middle conductive structures (e.g., 130, 135, 140, 145, 150, 155), the first and the second top conductive structures (e.g., 190, 195), and the capacitor 210 may be all formed in a back-end-of-line (BEOL) network.

Each of the plurality of unit memory cells may operate to control charges stored therein. In some embodiments, the capacitor 210 stores an amount of electrical charges. The charges stored in the capacitor 210 can be altered based on a pulse signal 360. For example, the pulse signal 360 may be a voltage signal applied on the second bottom conductive structure 115. In some embodiments, the pulse signal 360 may include at least one logic high state 370 (e.g., high voltage) and one logic low state 380 (e.g., log voltage). When the pulse signal 360 presents the logic low state 380, a first discharge path 310 is formed, e.g., from the capacitor 210, through the first middle conductive structure 130, and to the fourth middle conductive structure 145. In some embodiments, when the pulse signal 360 presents the logic high state 370, a second discharge path 320 is formed, e.g., from the fourth middle conductive structure 145, through the second middle conductive structure 135, and to the third middle conductive structure 140. In some embodiments, when the pulse signal 360 presents the logic high state 370, the second discharge path 320 is formed, e.g., from the fourth middle conductive structure 145, to the sixth middle conductive structure 155. In some embodiments, when the pulse signal 360 presents the logic high state 370, the second discharge path 320 is formed, e.g., from the fourth middle conductive structure 145, through the second middle conductive structure 135, and to the fifth middle conductive structure 150. In some embodiments, the second discharge path 320 may be formed from the fourth middle conductive structure 145, to one or more of the third middle conductive structure 140, the fifth middle conductive structure 150, and the sixth middle conductive structure 155.

For example, the capacitor 210 may have a capacitance of 10 fF. After a "write step" of storing charges in the capacitor 210, the amount of charges stored in the capacitor 210 can be altered by a two-phase change in the second bottom conductive structure 115 (sometimes referred to as "UnSel_WL"). Initially, the first top conductive structure 190 (sometimes referred to as "bitline 1") and the second top conductive structure 195 (sometimes referred to as "bitline 1x") may be at a certain voltage (e.g., 0 V), and other top conductive structures (not shown) may be floating (e.g., high impedance), while the first bottom conductive structure 110 (sometimes referred to as "Sel_WL") may be kept OFF (e.g., −0.6 V). When the pulse signal 360 is applied on the second bottom conductive structure 115 (e.g., UnSel_WL), the charges stored in the capacitor 210 can be altered. During the logic low state 380 (e.g., a low voltage is applied on the second bottom conductive structure 115), the voltage at the fourth middle conductive structure 145 is pulled down, such that the first discharge path 310 forms. For example, at least a portion of the charges stored in the capacitor 210 moves to the fourth middle conductive structure 145. During the logic high state 370 (e.g., a high voltage is applied on the second bottom conductive structure 115), and when the fourth middle conductive structure 145 contains some charges, the device by the UnSel_WL is ON, and the second discharge path 320 forms (e.g., from the fourth middle conductive structure 145 to one or more of the third middle conductive structure 140, the fifth middle conductive structure 150, and the sixth middle conductive structure 155) by the charges stored at the fourth middle conductive structure 145. For example, at least a portion of the charges in the fourth middle conductive structure 145 moves to one or more of the third middle conductive structure 140, the fifth middle conductive structure 150, and the sixth middle conductive structure 155.

Figure 4A:
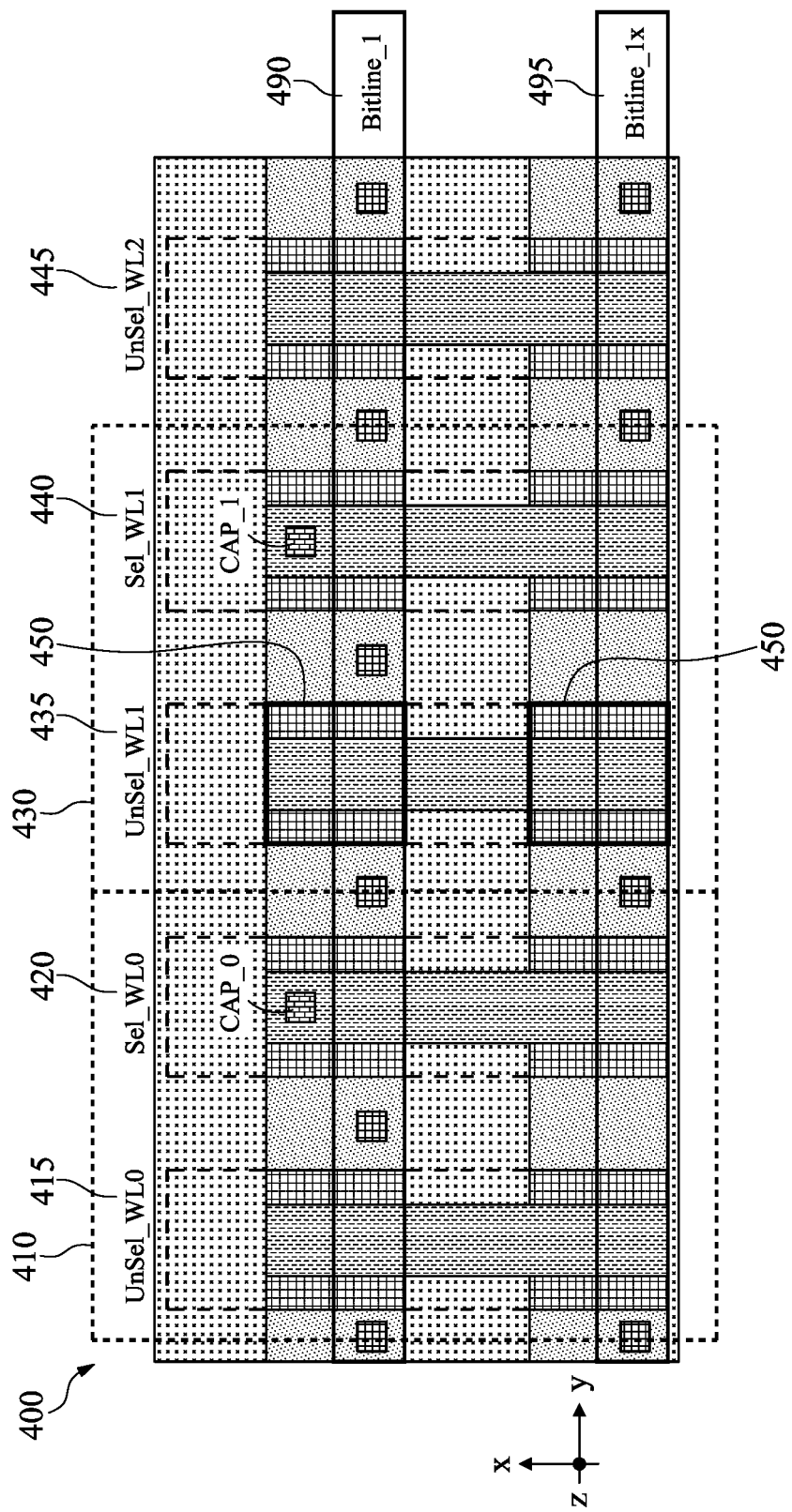
FIG. 4A illustrates a top view of a memory device, in accordance with some embodiments.

FIG. 4A illustrates a top view of a memory device 400, in accordance with some embodiments. The memory device 400 may include a plurality of unit memory cells (e.g., the unit memory cell described with respect to FIG. 3; e.g., a first unit cell 410, a second unit cell 430). The memory device 400 may include a plurality of storage circuits or memory cells arranged in two or three dimensional arrays. Each of the memory cells may be coupled to a corresponding word line (WL), a corresponding bit line (BL), and/or a corresponding source line (SL), thereby allowing them to connect to each other. Specifically, respective transistors in each memory cell may be coupled to the WL, the BL, and the SL, which connect the plurality of memory cells over the array. For example, the first unit cell 410 and the second unit cell 430 may be connected to each other by coupling respective transistors to Bitline_1 490 and Bitline_1x 495.

In some embodiments, a memory controller (now shown) may write data to or read data from the memory array according to electrical signals through WLs, BLs, and SLs. For example, the memory device 400 can be operated according to voltages or currents through the corresponding WLs, the corresponding BLs, and the corresponding SLs. Each memory cell (e.g., 410, 430) may include a volatile memory, a non-volatile memory, or a combination of them. In some embodiments, the memory device 400 may be operated according to a voltage/current pulse, such that the pulse controls data modulation and charges stored in a capacitor. In some embodiments, the memory device 400 may include additional lines (e.g., reference lines, reference control lines, power rails, etc.).

In some embodiments, each of the unit cells 410, 430 in the array may operate independently of each other. For example, referring to FIG. 4A, the second unit cell 430 may form on-channel 450 independently of neighboring unit cells (e.g., the first unit cell 410). For example, while Bitline_1 490 and Bitline_1x 495 are biased at a voltage (e.g., 0 V), UnSel_WL1 435 may be biased at "High" (e.g., 1.5 V), and UnSel_WL0 415, Sel_WL0 420, Sel_WL1 440, and UnSel_WL2 445 are biased at "Off" (e.g., −0.7 V). In this case, the on-channel 450 can form, and charges stored in the second unit cell 430 (e.g., in a capacitor or in a middle conductive structure) can form a discharge path through the on-channel 450.

Figure 4B:
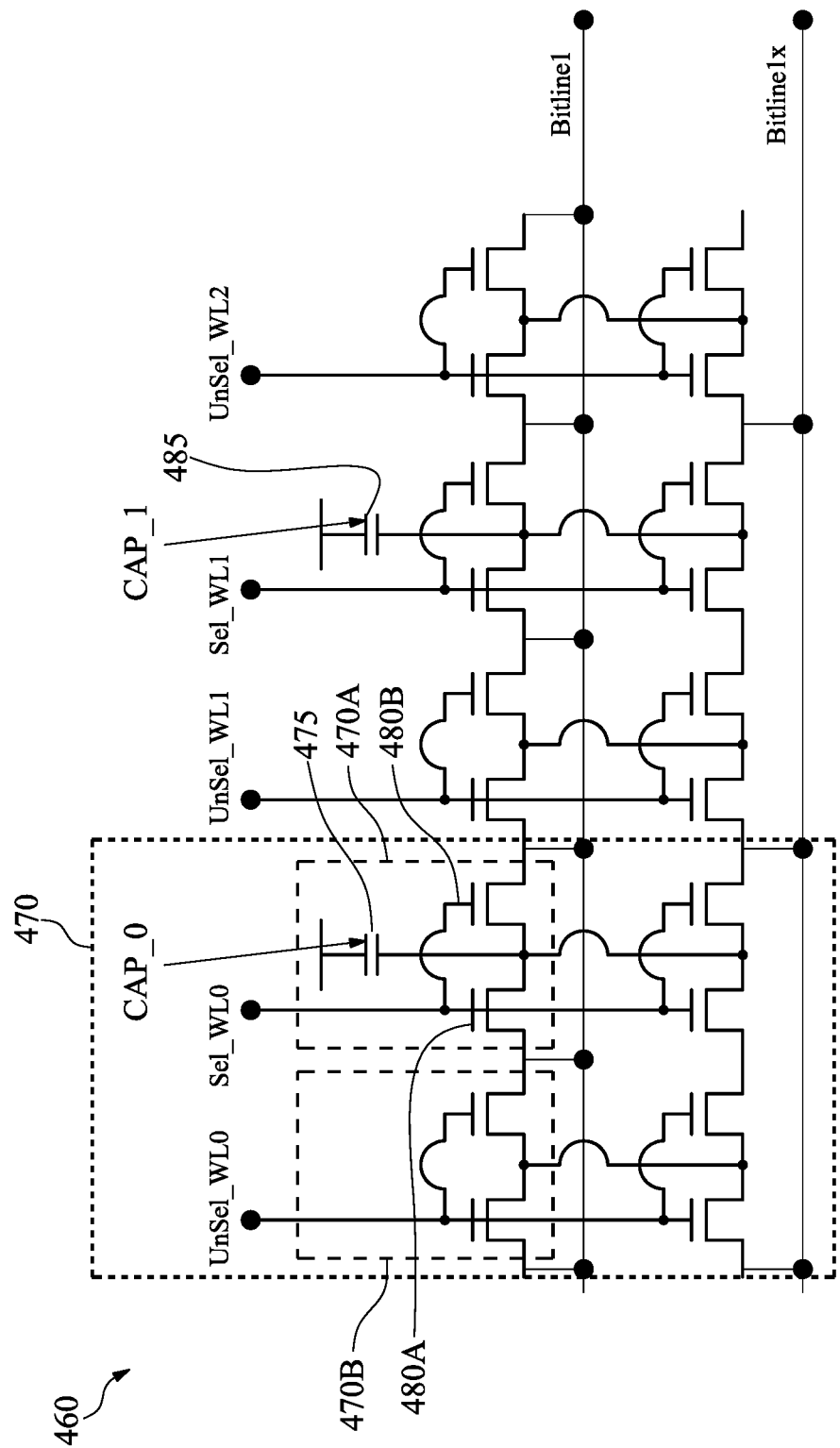
FIG. 4B illustrates a circuit diagram corresponding to a unit cell in FIG. 4A, in accordance with some embodiments.

FIG. 4B illustrates a circuit diagram 460 corresponding to a number of unit cells in FIG. 4A, in accordance with some embodiments. The circuit diagram 460 includes multiple unit circuits 470, each of which may be an equivalent circuit corresponding to a unit cell (e.g., the first unit cell 410) of the memory device 400. As a non-limiting example, the unit circuit 470 may include a plurality of sub-circuits (e.g., sub-circuits 470A, 470B). The sub-circuit 470A may include a pair of transistors (e.g., 480A, 480B) and a capacitor (e.g., 475). The two transistors 480A, 480B, which are connected to each other in parallel, may be connected to the first capacitor 475 in series. The two transistors 480A, 480B may operatively serve as select or access transistors for the memory cell, and the first capacitor 475 may operatively serve as a storage element for the memory cell. In accordance with various embodiments, those two access transistors and the storage capacitor may all be formed in the BEOL processing. For example, the access transistors may each be formed as a back-gate transistor having its gate terminal disposed on a backside of its channel and its drain and source terminal disposed on a frontside of the channel, and the storage capacitor (e.g., 475) may be formed as a metal-insulator-metal (MIM) structure or a metal-oxide-metal (MOM) structure. The sub-circuit 470B, as opposed to the sub-circuit 470A, does not include a capacitor.

In one configuration, the sub-circuits 470A, 470B are coupled to a corresponding BL (e.g., Bitline 1 490). The sub-circuit 470A is coupled to a corresponding WL (e.g., Sel_WL0 420), and the sub-circuit 470B is coupled to a corresponding WL (e.g., UnSel_WL0 415). Specifically, respective gate terminals of the transistors 480A and 480B are commonly connected to Sel_WL0 420; respective drain terminals of the transistors 480A and 480B are commonly connected to Bitline 1 490; and respective source terminals of the transistors 480A and 480B are commonly connected to the SL through the first capacitor 475. Each of the other sub-circuit (e.g., 470B) may be configured similarly as illustrated in FIG. 4B, except a capacitor being omitted in the sub-circuit 470B. Each of the other unit cells (e.g., the second unit cell 430) may be configured similarly to the first unit cell 410 as illustrated in FIG. 4B, and thus, the description will not be repeated. As discussed with respect to FIG. 4A, by coupling the respective gate terminals of the transistors (e.g., 480A, 480B) of each memory cell (e.g., 470) to a corresponding BL, WL, and/or SL, a plurality of memory cells may be connected to each other. For example, the unit cell 470 may be connected to a neighboring cell by coupling transistors (including 480A and 480B) to Bitline_1 490 and Bitline_1x 495.

In some embodiments, the memory device 400 may include a plurality of memory cells, each of the plurality of memory cells including a capacitor (e.g., 475) configured to store an amount of electrical charges, and a plurality of transistors (e.g., 480A, 480B) electrically coupled to the capacitor (e.g., 475). Based on a pulse signal, a first subset of the plurality of transistors are configured to form a first conduction path, and a second subset of the plurality of transistors are configured to form a second conduction path, thereby altering the amount of electrical charges through the first conduction path and the second conduction path. In some embodiments, the plurality of memory cells are all formed in a back-end-of-line network. For example, the plurality of transistor may be each formed as a back-gate transistor, with a channel formed above a gate structure (e.g., as shown in FIG. 2). In some embodiments, the pulse signal including at least one logic high state and one logic low state is applied to a gate structure of the second subset of transistors, while the first subset of transistors is turned off. For example, when the pulse signal presents the logic low state, the first conduction path is formed to discharge the electrical charges stored in the capacitor. For example, when the pulse signal presents the logic high state, the second conduction path is formed to continue discharging the electrical charges stored in the capacitor.

Figure 5:
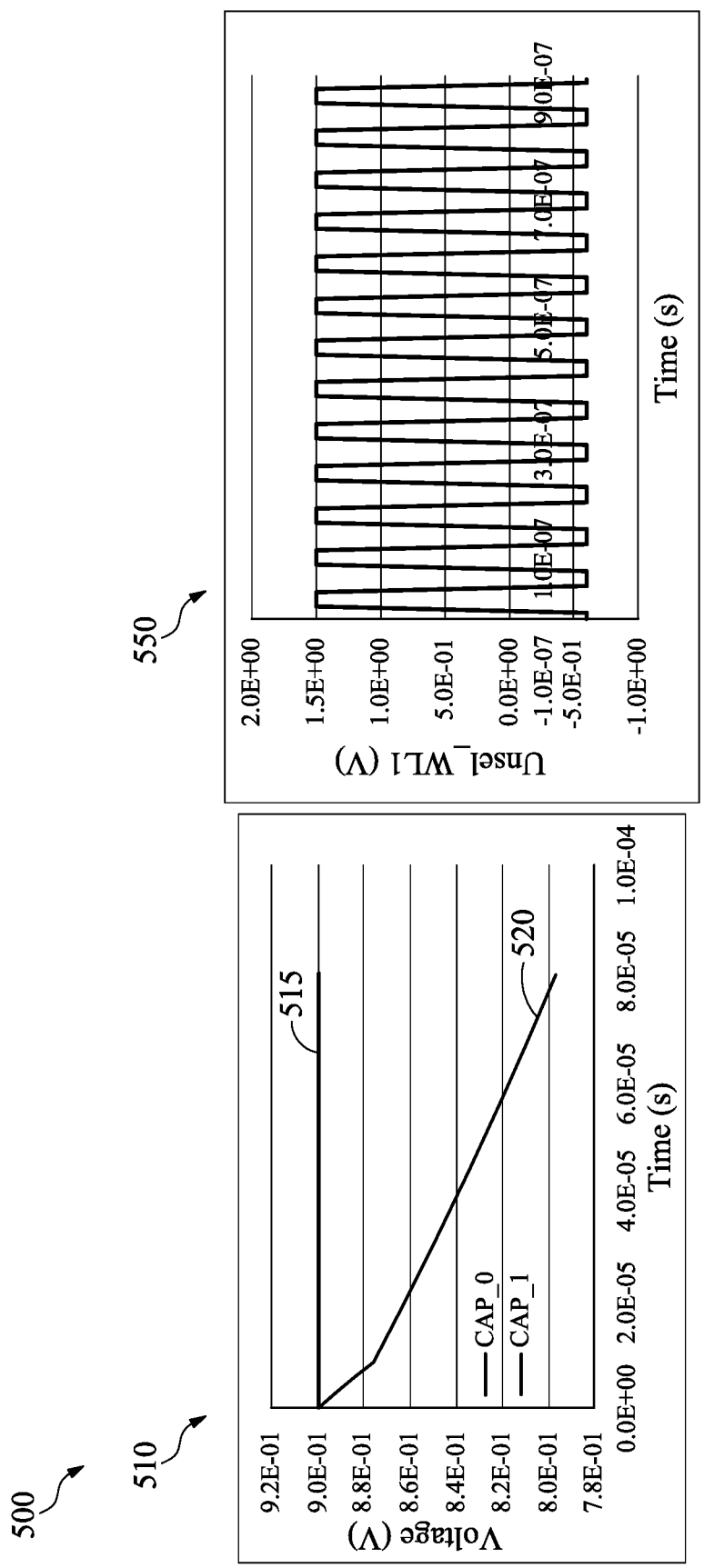
FIGS. 5, 6, and 7 illustrate example signals applied to and presented by a memory device, in accordance with some embodiments.

FIG. 5 shows example signals 510, 550 applied to and presented by a memory device, in accordance with some embodiments. In some embodiments, the signal 510 may be an output signal of one or more components in the memory device 400, when the signal 550 is applied on at least one component in the memory device 400. For example, the signal 510 may include a voltage measured at the first capacitor 475. For example, the signal 510 may include a voltage measured at the second capacitor 485.

In some embodiments, the first capacitor 475 and the second capacitor 485 may be charged to a certain voltage (e.g., 0.9 V). When a single row of an array of a memory device (e.g., the memory device 400) is considered, Bitline_1 490 and Bitline_1x 495 may be kept at a certain voltage (e.g., 0 V) and the other rows (e.g., BLs) in the array may be kept floating (e.g., high impedance). Then, UnSel_WL0 415, Sel_WL0 420, Sel_WL1 440 and UnSel_WL2 445 may be kept OFF (e.g. −0.6V), while the signal 550 is applied on UnSel_WL1 435. For example, an alternating pulse of −0.6V/1.5 V may be applied on UnSel_WL1 435. CAP_0 signal 515 and CAP_1 signal 520 of the signal 510 may be voltage signals measured at the first capacitor 475 and the second capacitor 485, respectively. As shown in the signal 510, in some embodiments, the voltage measured by CAP_0 signal 515 may be kept unchanged while the voltage measured by CAP_1 signal 520 is altered. In some embodiments, the voltage measured by CAP_0 signal 515 may be altered, by applying a pulse on UnSel_WL0 415.

Figure 6:
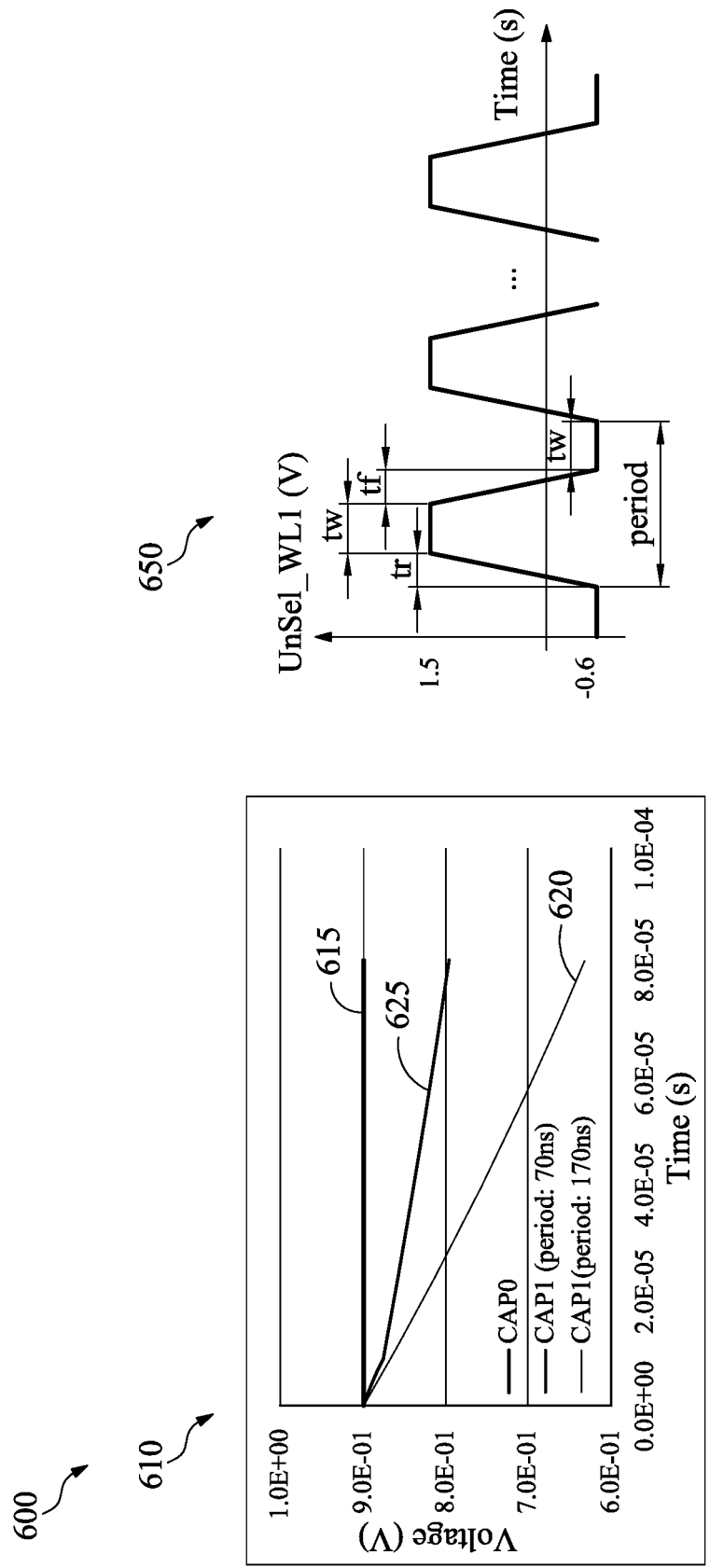

FIG. 6 shows example signals 610, 650 applied to and presented by a memory device, in accordance with some embodiments. In some embodiments, the signal 610 may be an output signal of one or more components in the memory device 400, responsive to the signal 650 applied on at least one component in the memory device 400. For example, the signal 610 may include a voltage measured at the first capacitor 475 and a voltage measured at the second capacitor 485. For example, a first output 615 may be a voltage measured at the first capacitor 475, and a second output 620 and a third output 625 may be voltages measured at the second capacitor 485.

In some embodiments, the signal 650 applied on at least one component in the memory device 400 (e.g., UnSel_WL1 435) may vary in the pulse width (tw), which may change the time dependence of the signal 610. In some embodiments, the signal 650 applied on at least one component in the memory device 400 (e.g., UnSel_WL1 435) may vary in the pulse rising time (tr) and/or the pulse falling time (tf). In some embodiments, the signal 650 applied on at least one component in the memory device 400 (e.g., UnSel_WL1 435) may vary in the period, which is defined as: period=tr+tf+2×tw.

In some embodiments, by varying the signal 650 (e.g., varying the pulse width), the time dependence of the signal 610 (e.g., a voltage measured at a capacitor) may be changed. For example, the signal 650 may include a first signal applied on UnSel_WL1 435 with a first period being 170 ns=10 ns+10 ns+2×75 ns. Responsive to the first signal, the second output 620 (CAP1 (period: 170 ns)) may be measured at the second capacitor 485. For example, the signal 650 may include a second signal applied on UnSel_WL1 435 with a second period being 70 ns=10 ns+10 ns+2×25 ns. Responsive to the second signal, the third output 625 (CAP1 (period:70 ns)) may be measured at the second capacitor 485. As discussed with respect to FIG. 5, and as shown in FIG. 6, the voltage measured at the second capacitor 485 may be altered independently of the first output 615 (CAP0) that is measured at the first capacitor 475 and that is kept unchanged, by applying the signal 650 on UnSel_WL1 435 while keeping UnSel_WL0 415, Sel_WL0 420, Sel_WL1 440 and UnSel_WL2 445 OFF (e.g. –0.6 V). For example, the first output 615 may be kept unchanged while varying the voltage measured at the second capacitor 485 (e.g., 620, 625).

Figure 7:
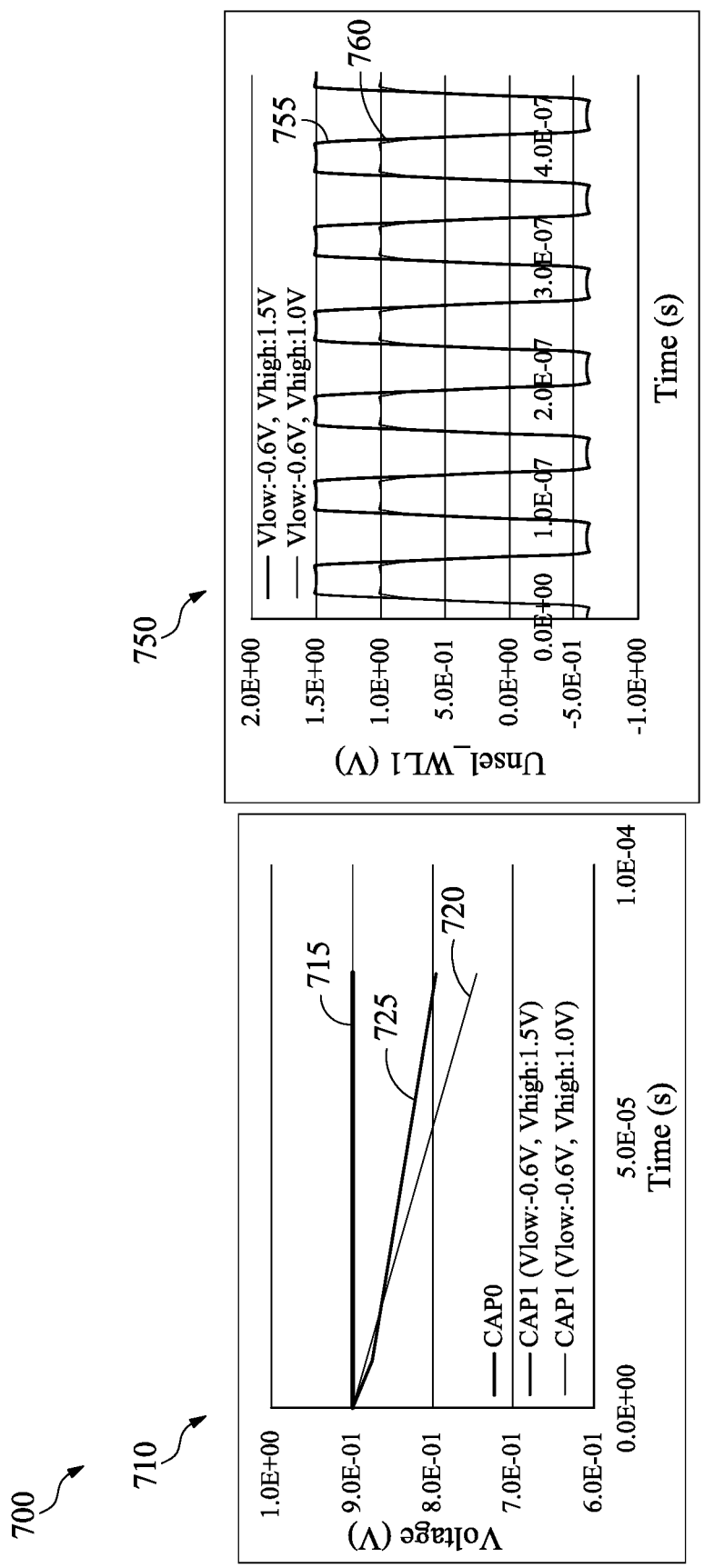

FIG. 7 shows example signals 710, 750 applied to and presented by a memory device, in accordance with some embodiments. In some embodiments, the signal 710 may be an output signal of one or more components in the memory device 400, responsive to the signal 750 applied on at least one component in the memory device 400. For example, the signal 710 may include a voltage measured at the first capacitor 475 and a voltage measured at the second capacitor 485. For example, a first output 715 (CAP0) may be a voltage measured at the first capacitor 475, and a second output 720 (CAP1 (Vlow: –0.6 V, Vhigh: 1.0 V)) may be a voltage measured at the second capacitor 485 responsive to a first input 755 (Vlow: –0.6V, Vhigh: 1.5 V). For example, a third output 725 (CAP1 (Vlow: –0.6 V, Vhigh: 1.5 V)) may be a voltage measured at the second capacitor 485 responsive to a second input 760 (Vlow: –0.6 V, Vhigh: 1.0 V).

In some embodiments, a voltage measured at the second capacitor 485 may change by varying an amplitude of the signal 750 (e.g., 755, 760). For example, a user can vary the amplitude of the input signal 750 applied on UnSel_WL1 435 to change the time dependence of the voltage measured at the second capacitor 485. For example, the first input 755 may switch between –0.6 V and 1.5 V, and the second input 760 may switch between –0.6 V and 1.0 V while the first input 755 and the second input 760 has a same period (e.g., 70 ns=10 ns+10 ns+2×25 ns). The first output 715 may be kept unchanged while varying the voltage measured at the second capacitor 485 (e.g., 720, 725).

Figure 8:
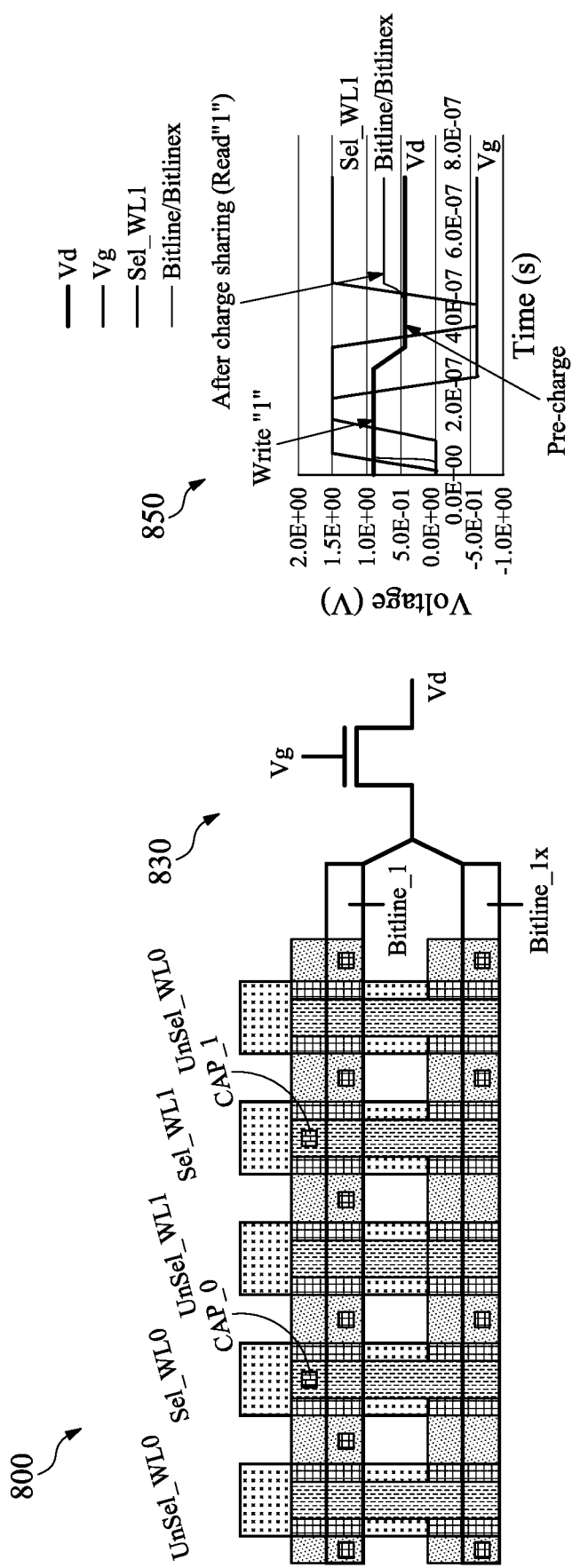
FIG. 8 illustrates a memory device and a waveform, in accordance with some embodiments.

FIG. 8 illustrates a memory device 800, a transistor 830, and a waveform 850, in accordance with some embodiments. The memory device 800 may be substantially identical to the memory device 400. In some embodiments, bitlines (e.g., Bitline 1 and Bitline 1x as shown in FIG. 8) of the memory device 800 may be connected to the transistor 830. Although a simplified example is shown, the memory device 800 may be connected to a sense amplifier (SA) in various embodiments.

The waveform 850 is associated with operation of the memory device 800 when the memory device 800 is connected to the transistor 830, and signals are applied to the memory device 800 and/or the transistor 830. Specifically, the waveform 850 shows signals when the memory device 800 performs a write/read operation. For example, the initial voltage at a first capacitor (CAP_0) and a second capacitor (CAP_1) may be 0 V. "UnSel_WL0," "UnSel_WL1," "UnSel_WL2," and "Sel_WL0" may be kept OFF (e.g., –0.6 V). By applying a signal, "Sel_WL1," Vd and Vg may follow the waveform 850. In various embodiments, a bias may be applied under various conditions to implement "write," "pre-charge," and "read" operations. During the read and write operations, a logic high may be applied, and during the pre-charge operation, a logic low may be applied.

Figure 9:
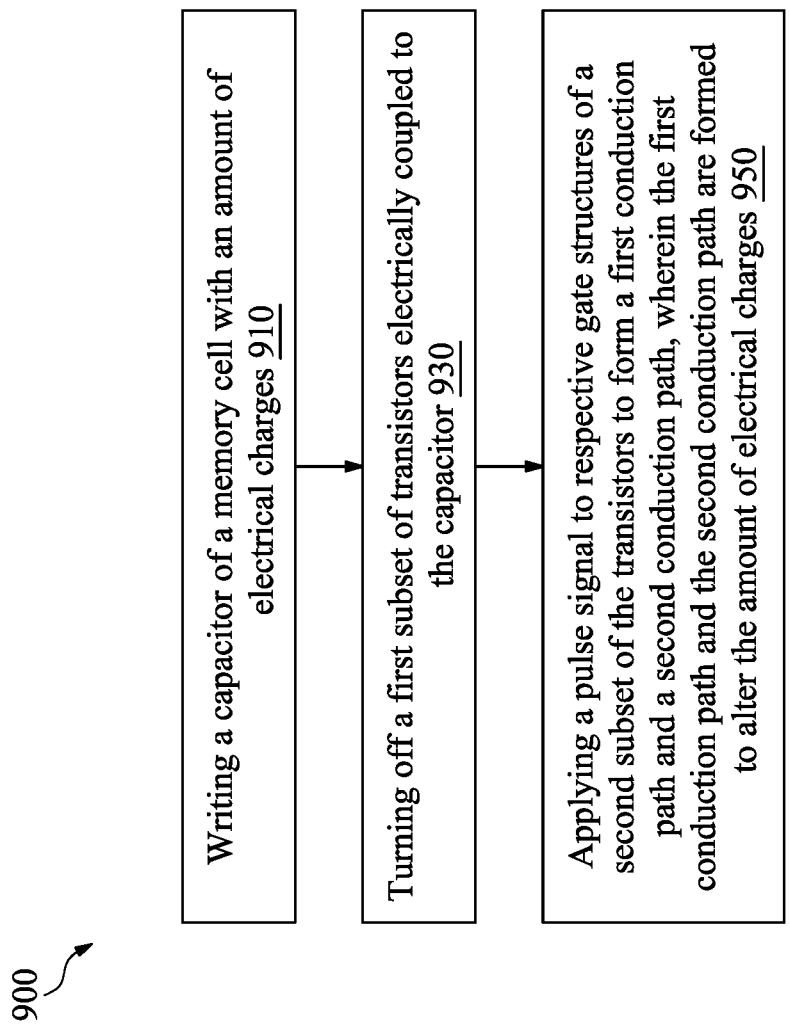
FIG. 9 shows an example flow chart of a method for operating a memory device, in accordance with some embodiments.

FIG. 9 shows an example flow chart of a method 900 for operating a memory device, in accordance with some embodiments. The method 900 may be performed any of the memory device disclosed herein or a portion or a component thereof. For example, the method 900 can be performed on any of the memory device or a component thereof discussed with respect to FIG. 1 to FIG. 8. For example, at least some of the operations of the method 900 may be performed on a memory device (e.g., 300 of FIG. 3). Accordingly, the following discussion of the method 900 may refer to some of the reference numerals used in FIG. 1 to FIG. 8 as a non-limiting example. Further, the method 900 is merely an example, and is not intended to limit the present disclosure. It should thus be understood that additional operations may be provided before, during, and after the method 900 of FIG. 9, and that some other operations may only be briefly described herein.

The method 900 may include writing a capacitor of a memory cell with an amount of electrical charges, turning off a first subset of transistors electrically coupled to the capacitor, and applying a pulse signal (e.g., 360) to respective gate structures of a second subset of the transistors to form a first conduction path (e.g., 310) and a second conduction path (e.g., 320). The first conduction path and the second conduction path may be formed to alter the amount of electrical charges. (e.g., the amount of electrical charges stored in the capacitor 210). In some embodiments, the capacitor and the transistors are all formed in a back-end-of-line network. In some embodiments, the pulse signal (e.g., 360) presents a logic low state (e.g., 380), the first conduction path is formed to discharge the electrical charges stored in the capacitor, and when the pulse signal (e.g., 360) presents a logic high state (e.g., 370), the second conduction path is formed to continue discharging the electrical charges stored in the capacitor.

In some embodiments, the method 900 may start with writing a capacitor of a memory cell with an amount of electrical charges (operation 910). For example, the capacitor may be charged to a certain voltage (e.g., 0.9 V). The method 900 may continue to turning off a first subset of transistors electrically coupled to the capacitor (operation 930). For example, the first subset of transistors may be biased at −0.6 V. The method 900 may continue to applying a pulse signal (e.g., 360) to respective gate structures of a second subset of the transistors to form a first conduction path (e.g., 310) and a second conduction path (e.g., 320), wherein the first conduction path and the second conduction path are formed to alter the amount of electrical charges (operation 950). In some embodiments, the pulse signal (e.g., 360) may include a logic high state (e.g., 370) and a logic low state (e.g., 380). When the pulse signal presents the logic low state, the first conduction path is formed to discharge the electrical charges stored in the capacitor. When the pulse signal presents the logic high state, the second conduction path is formed to continue discharging the electrical charges stored in the capacitor.

Figure 10:
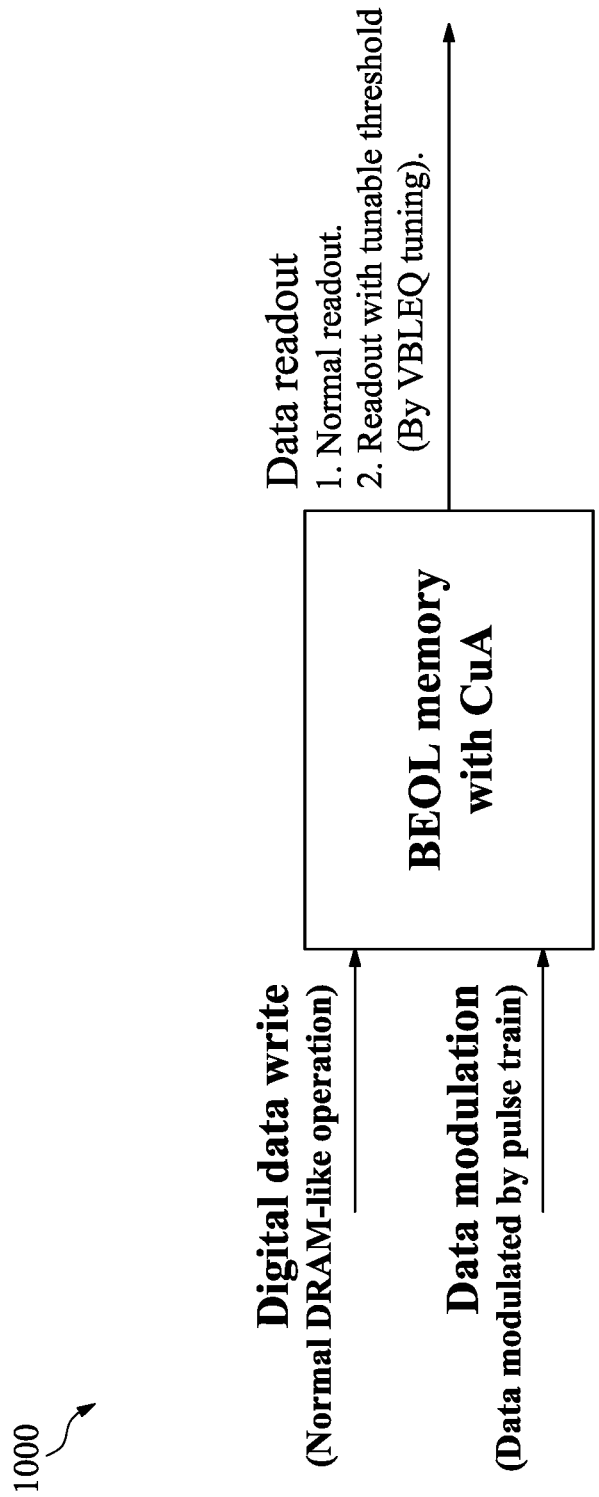
FIG. 10 shows a schematic diagram of example applications of a method for operating a memory device described herein.

FIG. 10 shows a schematic diagram 1000 of example applications of a method for operating a memory device, in accordance with some embodiments. The example applications of the method may be performed any of the memory device disclosed herein or a portion or a component thereof. For example, the example applications of the method can be performed on any of the memory device or a component thereof discussed with respect to FIG. 1 to FIG. 8. For example, the example applications of the method may be performed on a memory device (e.g., 300 of FIG. 3). Accordingly, the following discussion of the method 900 may refer to some of the reference numerals used in FIG. 1 to FIG. 8 as a non-limiting example. Further, example applications of the method described herein are merely examples, and are not intended to limit the present disclosure. It should thus be understood that additional operations may be provided with the example applications of the method shown in FIG. 10, and that some other operations may only be briefly described herein.

The methods may include modulating data by a controlling pulse (e.g., 360) while performing a normal memory operation (e.g., DRAM). In some embodiments, the methods include directly processing data stored in the array cells (e.g., electrical charges stored in the memory device 300) without transferring the data to a CPU/controller to modulate the data. For example, the methods include processing data stored in, for example memory array cells or image sensors (e.g., data stored as electrical charges in the memory device 300), directly without transferring the data to a controller for processing. In some embodiments, the methods include operating the memory device (e.g., 300) both as a normal memory and an in-situ data processing unit simultaneously without dedicated mode switching. For example, the different operations may be achieved based on operational signals (e.g., 360). In some embodiments, the methods may be directly implemented in the BEOL of a chip or of an image sensor so as to enable in-memory processing, thereby enhancing density (as all the arrays are in the BEOL), speed, and power from a system perspective. While providing various advantages, the methods of operating the memory device (e.g., 300) can serve as and/or be compatible with a memory, for example, as in DRAM devices. In some embodiments, the methods include naturally translating digital pulse train into analog value changes, and directly realizing neuromorphic computing and/or artificial intelligence. The methods for operating the memory device (e.g., 300) may include various data readout processes. Since the methods may include modulating data (e.g., by controlling electrical charges stored in the memory device 300) while performing a normal memory operation (e.g., DRAM), the methods may include a normal readout process for the normal memory operation while including a readout process with a tunable threshold (e.g., by tuning an equalization voltage of bitlines).

In one aspect of the present disclosure, a semiconductor device is disclosed. The semiconductor device includes a first bottom conductive structure and a second bottom conductive structure spaced from each other, each of the first and second bottom conductive structures extending along a first lateral direction; a first channel layer extending along a second lateral direction and traversing a first portion of each of the first and second bottom conductive structures; a second channel layer extending along the second lateral direction and traversing a second portion of each of the first and second bottom conductive structures; a first middle conductive structure extending along the first lateral direction, disposed above the first bottom conductive structure, and traversing the first and second channel layers; a second middle conductive structure extending along the first lateral direction, disposed above the second bottom conductive structure, and traversing the first and second channel layers; a third middle conductive structure disposed between the first and second middle conductive structures, and traversing a first portion of the first channel layer; a fourth middle conductive structure disposed between the first and second middle conductive structures, and traversing a first portion of the second channel layer; a fifth middle conductive structure disposed opposite the second middle conductive structures from the third middle conductive structure, and traversing a second portion of the first channel layer; a sixth middle conductive structure disposed opposite the second middle conductive structures from the fourth middle conductive structure, and traversing a second portion of the second channel layer; a first top conductive structure extending along the second lateral direction and electrically coupled to the third and fifth middle conductive structures; a second top conductive structure extending along the second lateral direction and electrically coupled to the sixth middle conductive structure; and a capacitor electrically coupled to the first middle conductive structure.

In another aspect of the present disclosure, a memory device is disclosed. The memory device includes a plurality of memory cells, each of the plurality of memory cells including: a capacitor configured to store an amount of electrical charges; and a plurality of transistors electrically coupled to the capacitor. Based on a pulse signal, a first subset of the plurality of transistors are configured to form a first conduction path, and a second subset of the plurality of transistors are configured to form a second conduction path. The amount of electrical charges is configured to be altered through the first conduction path and the second conduction path.

In yet another aspect of the present disclosure, a method for operating a memory device is disclosed. The method includes writing a capacitor of a memory cell with an amount of electrical charges; turning off a first subset of transistors electrically coupled to the capacitor; and applying a pulse signal to respective gate structures of a second subset of the transistors to form a first conduction path and a second conduction path. The first conduction path and the second conduction path are formed to alter the amount of electrical charges.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first bottom conductive structure and a second bottom conductive structure spaced from each other, each of the first and second bottom conductive structures extending along a first lateral direction;
   a first channel layer extending along a second lateral direction and traversing a first portion of each of the first and second bottom conductive structures;
   a second channel layer extending along the second lateral direction and traversing a second portion of each of the first and second bottom conductive structures;
   a first middle conductive structure extending along the first lateral direction, disposed above the first bottom conductive structure, and traversing the first and second channel layers;
   a second middle conductive structure extending along the first lateral direction, disposed above the second bottom conductive structure, and traversing the first and second channel layers;
   a third middle conductive structure disposed between the first and second middle conductive structures, and traversing a first portion of the first channel layer;
   a fourth middle conductive structure disposed between the first and second middle conductive structures, and traversing a first portion of the second channel layer;
   a fifth middle conductive structure disposed opposite the second middle conductive structures from the third middle conductive structure, and traversing a second portion of the first channel layer;
   a sixth middle conductive structure disposed opposite the second middle conductive structures from the fourth middle conductive structure, and traversing a second portion of the second channel layer;
   a first top conductive structure extending along the second lateral direction and electrically coupled to the third and fifth middle conductive structures;
   a second top conductive structure extending along the second lateral direction and electrically coupled to the sixth middle conductive structure; and
   a capacitor electrically coupled to the first middle conductive structure.

2. The semiconductor device of claim 1, further comprising:
   a first via structure connecting the third middle conductive structure to the first top conductive structure;
   a second via structure connecting the fifth middle conductive structure to the first top conductive structure; and
   a third via structure connecting the sixth middle conductive structure to the second top conductive structure.

3. The semiconductor device of claim 1, further comprising:
   a fourth via structure connecting the first middle conductive structure to the capacitor.

4. The semiconductor device of claim 3, wherein the fourth via structure is shifted from the first top conductive structure along the first lateral direction.

5. The semiconductor device of claim 4, wherein the fourth via structure vertically extends across any of the first or second top conductive structure.

6. The semiconductor device of claim 1, wherein the capacitor includes a metal-insulator-metal (MIM) structure or metal-oxide-metal (MOM) structure.

7. The semiconductor device of claim 1, wherein the first and second bottom conductive structures, the first and second channel layers, the first to sixth middle conductive structures, the first to second top conductive structures, and the capacitor operatively serve as a single memory cell.

8. The semiconductor device of claim 7, wherein the capacitor is configured to store an amount of electrical charges that can be altered based on a pulse signal applied on the second bottom conductive structure, the pulse signal including at least one logic high state and one logic low state.

9. The semiconductor device of claim 8, wherein when the pulse signal presents the logic low state, a first discharge path is formed from the capacitor, through the first middle conductive structure, and to the fourth middle conductive structure.

10. The semiconductor device of claim 9, wherein when the pulse signal presents the logic high state, a second discharge path is formed from the fourth middle conductive structure, through the second middle conductive structure, and to the third middle conductive structure.

11. The semiconductor device of claim 1, wherein the first and second bottom conductive structures, the first and second channel layers, the first to sixth middle conductive structures, the first to second top conductive structures, and the capacitor are all formed in a back-end-of-line network.

12. A semiconductor device, comprising:
    a first bottom conductive structure and a second bottom conductive structure, each of the first and second bottom conductive structures extending along a first lateral direction;
    a first channel layer extending along a second lateral direction and disposed above the first and second bottom conductive structures;
    a second channel layer extending along the second lateral direction and disposed above the first and second bottom conductive structures;
    a first middle conductive structure extending along the first lateral direction and disposed above the first bottom conductive structure, the first channel layer, and the second channel layer;
    a second middle conductive structure extending along the first lateral direction and disposed above the second bottom conductive structure, the first channel layer, and the second channel layer;
    a third middle conductive structure disposed between the first and second middle conductive structures and disposed above the first channel layer;
    a fourth middle conductive structure disposed between the first and second middle conductive structures and disposed above the second channel layer;
    a fifth middle conductive structure disposed opposite the second middle conductive structure from the third middle conductive structure;

a sixth middle conductive structure disposed opposite the second middle conductive structure from the fourth middle conductive structure;

a first top conductive structure extending along the second lateral direction and electrically coupled to the third and fifth middle conductive structures;

a second top conductive structure extending along the second lateral direction and electrically coupled to the sixth middle conductive structure; and a capacitor electrically coupled to the first middle conductive structure.

13. The semiconductor device of claim 12, further comprising:

a first via structure connecting the third middle conductive structure to the first top conductive structure;

a second via structure connecting the fifth middle conductive structure to the first top conductive structure;

a third via structure connecting the sixth middle conductive structure to the second top conductive structure; and a fourth via structure connecting the first middle conductive structure to the capacitor.

14. The semiconductor device of claim 13, wherein the fourth via structure is shifted from the first top conductive structure along the first lateral direction, and wherein the fourth via structure vertically extends across any of the first or second top conductive structure.

15. The semiconductor device of claim 12, wherein the capacitor includes a metal-insulator-metal (MIM) structure or metal-oxide-metal (MOM) structure.

16. The semiconductor device of claim 12, wherein the first and second bottom conductive structures, the first and second channel layers, the first to sixth middle conductive structures, the first to second top conductive structures, and the capacitor operatively serve as a single memory cell.

17. The semiconductor device of claim 12, wherein the first and second bottom conductive structures, the first and second channel layers, the first to sixth middle conductive structures, the first to second top conductive structures, and the capacitor are all formed in a back-end-of-line network.

18. A semiconductor device, comprising:

a first bottom conductive structure and a second bottom conductive structure spaced from each other, each of the first and second bottom conductive structures;

a first channel layer traversing a first portion of each of the first and second bottom conductive structures;

a second channel layer traversing a second portion of each of the first and second bottom conductive structures;

a first middle conductive structure disposed above the first bottom conductive structure and traversing the first and second channel layers;

a second middle conductive structure disposed above the second bottom conductive structure and traversing the first and second channel layers;

a third middle conductive structure disposed between the first and second middle conductive structures, and traversing a first portion of the first channel layer;

a fourth middle conductive structure disposed between the first and second middle conductive structures, and traversing a first portion of the second channel layer;

a fifth middle conductive structure disposed opposite the second middle conductive structures from the third middle conductive structure, and traversing a second portion of the first channel layer;

a sixth middle conductive structure disposed opposite the second middle conductive structures from the fourth middle conductive structure, and traversing a second portion of the second channel layer;

a first top conductive structure electrically coupled to the third and fifth middle conductive structures;

a second top conductive structure electrically coupled to the sixth middle conductive structure;

a capacitor electrically coupled to the first middle conductive structure; and one or more via structures (i) connecting the third middle conductive structure to the first top conductive structure, (ii) connecting the fifth middle conductive structure to the first top conductive structure, or (iii) connecting the sixth middle conductive structure to the second top conductive structure.

19. The semiconductor device of claim 18, wherein the capacitor includes a metal-insulator-metal (MIM) structure or metal-oxide-metal (MOM) structure.

20. The semiconductor device of claim 18, wherein the first and second bottom conductive structures, the first and second channel layers, the first to sixth middle conductive structures, the first to second top conductive structures, and the capacitor operatively serve as a single memory cell.

* * * * *